US010816891B2

(12) United States Patent
Chang et al.

(10) Patent No.: US 10,816,891 B2
(45) Date of Patent: Oct. 27, 2020

(54) PHOTOMASK AND FABRICATION METHOD THEREFOR

(71) Applicant: TAIWAN SEMICONDUCTOR MANUFACTURING COMPANY, LTD., Hsinchu (TW)

(72) Inventors: Hao-Ming Chang, Hsinchu (TW); Chien-Hung Lai, Taichung (TW); Cheng-Ming Lin, Siluo Township (TW); Hsuan-Wen Wang, Hsinchu (TW); Min-An Yang, Taichung (TW); S. C. Hsu, Sijhih (TW); Shao-Chi Wei, Hsinchu (TW); Yuan-Chih Chu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 342 days.

(21) Appl. No.: 15/481,009

(22) Filed: Apr. 6, 2017

(65) Prior Publication Data
US 2018/0164675 A1    Jun. 14, 2018

Related U.S. Application Data

(60) Provisional application No. 62/434,277, filed on Dec. 14, 2016.

(51) Int. Cl.
G03F 1/26 (2012.01)
G03F 1/80 (2012.01)
G03F 1/38 (2012.01)
G03F 1/32 (2012.01)
G03F 1/30 (2012.01)

(52) U.S. Cl.
CPC ............... *G03F 1/26* (2013.01); *G03F 1/30* (2013.01); *G03F 1/32* (2013.01); *G03F 1/38* (2013.01); *G03F 1/80* (2013.01)

(58) Field of Classification Search
CPC ..... G03F 1/26; G03F 1/30; G03F 1/32; G03F 1/80
See application file for complete search history.

(56) References Cited

U.S. PATENT DOCUMENTS

| 5,830,332 A | 11/1998 | Babich et al. |
| 6,045,954 A | 4/2000 | Dai et al. |
| 6,921,702 B2 | 7/2005 | Ahn et al. |
| 7,498,247 B2 | 3/2009 | Ahn et al. |
| 8,279,409 B1* | 10/2012 | Sezginer .................. G03F 1/70 355/67 |
| 2003/0228529 A1 | 12/2003 | Dieu et al. |
| 2004/0137335 A1 | 7/2004 | Cummings |
| 2005/0053847 A1 | 3/2005 | Martin et al. |
| 2005/0054165 A1 | 3/2005 | Ahn et al. |
| 2005/0186487 A1* | 8/2005 | Inazuki .................. G03F 1/32 430/5 |
| 2008/0102379 A1* | 5/2008 | Wu .......................... G03F 1/26 430/5 |
| 2009/0246645 A1* | 10/2009 | Nozawa .................. G03F 1/34 430/5 |

OTHER PUBLICATIONS

M. Waiblinger et al., "e-beam induced EUV photomask repair—a perfect match", Proc. of SPIE vol. 7545, 26th Europena Mask and Lithography Conference, May 15, 2010, pp. 75450P-1-754509-8.
J. Niinistö et al., "Structural and dielectric properties of thin $ZrO_2$ films on silicon grown by atomic layer deposition from cyclopentadienyl precursor", Journal of Applied Physics 95, 84 (2004); doi: 10.1063/1.1630696, Jan. 1, 2004; pp. 84-91.
S. Sayan et al., "Chemical vapor deposition of $HfO_2$ films on Si(100)", Journal of Vacuum Science & Technology A 20, 507 (2002); doi: 10.1116/1.1450584, Mar./Apr. 2002, pp. 507-512.
S. Sayan et al., "Structural, electronic, and dielectric properties of ultrathin zirconia films on silicon", Applied Physics Letters 86, 152902 (2005); doi: 10.1063/1.1864235, 4 pages.
Byoung Hun Lee et al., "Thermal stability and electrical characteristics of ultrathin hafnium oxide gate dielectric reoxidized with rapid thermal annealing", Applied Physics Letters 76, 1926 (2000); doi: 10.1063/1.126214, pp. 1926-1928.
W. J. Zhu et al., "Effect of Al Inclusion in $HfO_2$ on the Physical and Electrical Properties of the Dielectrics", IEEE Electron Device Letters, vol. 23, No. 11, Nov. 2002, pp. 649-651.
Jing Tang et al., "Solid-Solution Nanoparticles: Use of a Nonhydrolytic Sol-Gel Synthesis to Prepare $HfO_2$ and $Hf_xZr_{1-x}O_2$ Nanocrystals", Chem. Mater., vol. 16, No. 7, 2004, pp. 1336-1342.

* cited by examiner

Primary Examiner — Daborah Chacko-Davis
(74) Attorney, Agent, or Firm — Hauptman Ham, LLP

(57) ABSTRACT

A method of manufacturing a mask includes depositing an end-point layer over a light transmitting substrate, depositing a phase shifter over the end-point layer, depositing a hard mask layer over the phase shifter, and removing a portion of the hard mask layer and a first portion of the phase shifter to expose a portion of the end-point layer. The end-point layer and the light transmitting substrate are transparent to a predetermined wavelength.

20 Claims, 6 Drawing Sheets

PHOTOMASK AND FABRICATION METHOD THEREFOR

PRIORITY CLAIM

The instant application is a non-provisional application claiming priority to Provisional Application No. 62/434,277, filed Dec. 14, 2016, the entire content of which is incorporated by reference herein.

BACKGROUND

Photolithography is utilized in the fabrication of semiconductor devices to transfer a pattern onto a wafer. Based on various integrated circuit (IC) layouts, patterns of a mask are reduced by a factor of 2:1 or 4:1 in order to transfer the pattern to a surface of the wafer. The mask, also called a reticle, is made of a transparent substrate with one or more opaque materials deposited on one side to block light penetration. As dimensions decrease and density in IC chips increases, resolution enhancement techniques, such as phase-shift mask (PSM), optical proximity correction (OPC), off-axis illumination (OAI) and double dipole lithography (DDL), are developed to improve depth of focus (DOF) and to achieve a more precise pattern transfer onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
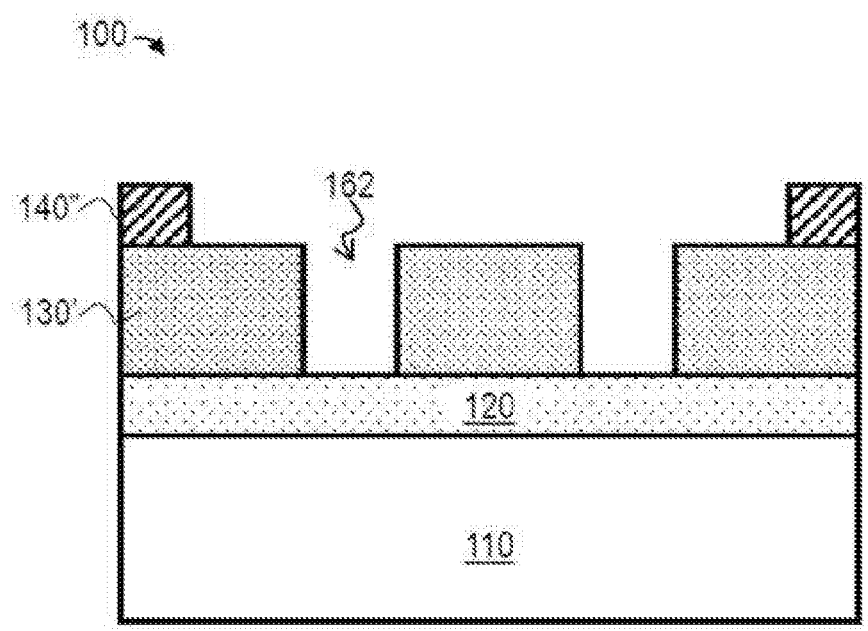
FIG. 1 is a cross-sectional view of a mask in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

As semiconductor device feature sizes have decreased to be smaller than a wavelength of light used in photolithography processes, the ability to manufacture the minimum feature size, also called critical dimensions (CD), becomes more sensitive to optical fringing of light passing through a mask or a reticle. A binary mask (BIM) includes a transparent substrate and an opaque layer. During the photolithography process, patterns are transferred to a surface of a wafer by transmitting light through the transparent substrate and blocking light, by the opaque layer, to selectively expose a photomask layer on a wafer. However, photoresist at an edge of the pattern is exposed under undesired light conditions resulting from constructive/destructive interference which affects an amount of light incident on the photoresist at the edge of the pattern. As a result, a pattern transferred to the wafer is distorted at the edges, degrading the resolution of the transferred pattern. In order to enhance the resolution when transferring the pattern, a phase shift mask (PSM) is used to shift a phase of selected light passing through the mask or the reticle by π (180 degrees), thereby the undesired light is offset by the destructive interference. Removing the undesired light helps to improve the precision of the image transfer. Typically, the PSM is categorized into an alternating PSM or an attenuated PSM. The alternating PSM induces the phase shift of light by adjusting a thickness of the substrate of the mask. In an attenuated PSM, portions of the substrate are covered by a phase shifter. A small percentage, e.g., from about 6% to about 9%, of light incident on the phase shifter propagates through the phase shifter. In some embodiments, about 12% of incident light propagates through the phase shifter. Regions of the substrate of the attenuated PSM which are exposed by the phase shifter permit about 99% of incident light to propagate through the substrate.

During a mask fabrication process, an electron beam (e-beam) writing technology is applied to write designs onto a mask and a backscattered electron (BSE) detector is used to monitor changes on a surface of the mask during a subsequent etch process. For example, for regions of the mask including the phase shifter, the BSE will monitor changes in the phase shifter; and for regions of the mask where the substrate is exposed, the BSE will monitor changes on the substrate. In some instances where an average atomic number (Z) of the phase shifter or the opaque layer is similar to an average atomic number of the substrate, an over-etching of the substrate happens because a signal contrast between the phase shifter or the opaque layer and the substrate is difficult to distinguish from each other. As a result, a light-scattering effect is increased and a quality of the mask is reduced. In some embodiments, in order to reduce the over-etching of the substrate, an end-point layer is formed over the substrate. In some approaches, an average atomic number of the end-point layer is sufficiently different from the average atomic number of the phase shifter or the opaque layer so as to result in an enhanced image contrast. In some approaches, the end-point layer is transparent to similar wavelengths as the substrate. In some approaches, the end-point layer includes a metal-containing dopant for minimizing a charging effect during the e-beam writing.

FIG. 1 is a cross-sectional view of a mask 100 in accordance with one or more embodiments. Mask 100 includes a substrate 110, an end-point layer 120, a phase shifter 130' and an opaque layer 140". Openings 162 are defined in phase shifter 130' in order to expose a portion of end-point layer 120. Substrate 110 is transparent to incident light, i.e., electromagnetic radiation, having a predetermined range of wavelengths. For example, in some embodiments, substrate 110 is transparent to near ultra violet (NUV) wavelengths (e.g., about 365 nanometers (nm)). In some embodiments, substrate 110 is transparent to deep ultra violet (DUV) wavelengths (e.g., about 284 nm). In some embodiments, substrate 110 is transparent to argon fluoride (ArF) laser (e.g., about 193 nm). In some embodiments, substrate 110 is transparent to extreme ultraviolet (EUV) wavelengths (e.g., about 13.5 nm). Substrate 110 includes glass, quartz, fused silica, calcium fluoride, silicon oxide-titanium oxide alloy, sapphire or another suitable material. In some embodiments, a thickness of substrate 110 ranges from about 0.25 centimeters (cm) to about 0.75 cm. A greater thickness increases a manufacturing cost without a significant improvement in functionality, in some instances. A smaller thickness increases a risk of cracking/breaking of mask 100 during a photolithography process, in some instances.

End-point layer 120 is over substrate 110 and functions as a stop layer during an end-point mode etch process. In some embodiments, end-point layer 120 is transparent to similar wavelengths as substrate 110. In order to help prevent incident light from being absorbed by end-point layer 120, in some embodiments where a light source is an ArF laser, a band gap energy of end-point layer 120 is equal to or greater than 6 electron volts (eV). A smaller band gap energy increases light absorption and results in a poor quality of image transfer, in some instances.

During the end-point mode etch process, the BSE is generated by an elastic interaction during a radiation scan. A BSE detector is placed above a target object based on a scattering geometry relative to the radiation scan. In some embodiments where a layer over end-point layer 120 includes a silicon-based material, an average atomic number of end-point layer 120 is greater than 14. A smaller average atomic number results in an insufficient distinction from the silicon-based material, in some instances. In some embodiments, in order to generate a sufficient contrast of BSE signal (Z-contrast) to determine a stop point (termination) of etch process and to expose end-point layer 120, a difference between an average atomic number of end-point layer 120 and an average atomic number of phase shifter 130' is greater than 50% of the average atomic number of phase shifter 130'. A smaller difference between the average atomic number of end-point layer 120 and the average atomic number of phase shifter 130' increases a risk of false end-point detection, in some instances. In some embodiments, the average atomic number of end-point layer 120 is at least two-times greater than the average atomic number of the layer above. In some embodiments, end-point layer 120 includes hafnium oxide, hafnium silicate, hafnium aluminum oxide, strontium hafnium oxide, zirconium oxide, zirconium aluminum oxide, silicon nitride or another suitable material. In some embodiments where end-point layer 120 includes silicon nitride and substrate 110 includes silicon oxide, a concentration of silicon atom in end-point layer 120 is at least 15% greater or smaller than a concentration of silicon atom in substrate 110. In some embodiments, end-point layer 120 includes a metal-containing dopant to help reduce a charging effect. The e-beam writing suffers from the charging effect resulting from electrons accumulating which affects an incoming e-beam, and degrades performance and causes CD errors.

Phase shifter 130' is over end-point layer 120 and has a different average atomic number from end-point layer 120, i.e., the average atomic number of phase shifter 130' is greater or smaller than end-point layer 120. Phase shifter 130' is configured to shift a phase of selected light passing through mask 100 by π, resulting in a destructive interference of the electric field of the light. The destructive interference of an electric field between waves from adjacent openings 162 reduces or completely eliminates some diffraction effects, causing a zero light intensity (square of the electric field) and preventing undesired light from reaching the wafer. Removing the undesired light helps to improve the precision of the image transfer and minimize a distance between a wafer and mask 100. In some embodiments where mask 100 is an attenuated phase-shift mask, a total transmission rate incident light of phase shifter 130' ranges from about 6% to about 9%. In some embodiments, where mask 100 is a high-transmission phase-shift mask, a total transmission rate incident light of phase shifter 130' ranges from about 18% to about 20%. In some embodiments, phase shifter includes a spin-on-glass (SPG) dielectric material. In some embodiments, phase shifter 130' includes silicon nitride, tantalum silicate, molybdenum silicide, molybdenum silicon oxynitride, tantalum nitride or another suitable material. In some embodiments, phase shifter 130' includes a single layer over substrate 110. In some embodiments, phase shifter 130' includes multiple layers, such as a combination of molybdenum silicide and silicon oxide. In some embodiments where both phase shifter 130' and end-point layer 120 include silicon nitride, a concentration of silicon atom in phase shifter 130' is different from a concentration of silicon atom in end-point layer 120 in order to generate a sufficient Z-contrast.

In some embodiments, phase shifter 130' has a different etch selectivity from end-point layer 120. In some embodiments, phase shifter 130' has a same etch selectivity from end-point layer 120 because under the end-point mode etch process a stop point is not determined by the etch selectivity.

Opaque layer 140" is over phase shifter 130' and is used to reduce undesired light leakage. In some embodiments, opaque layer 140" extends along a periphery of mask 100. In some embodiments where mask 100 includes repetitive pattern arrays, wherein each pattern array contains an image for an integrated circuit or die, opaque layer 140" extends along a periphery of each pattern to minimize negative effects caused by light leakage from the adjacent pattern. Opaque layer 140" is opaque to the wavelength of light transmitted through substrate 110, end-point layer 120 and phase shifter 130'. In at least one embodiment where mask 100 is a triton mask, opaque layer 140" is in a center region of mask 100 and has a transmission rate smaller than 0.1%. When the transmission rate is smaller than 0.1%, incident light is substantially absorbed and opaque layer 140" corresponds to a dark tone in mask 100. In the triton mask, end-point layer 120 and openings 162, i.e., exposed portions of end-point layer 120 are referred to as a clear tone and correspond to the pattern to be transferred, and opaque layer 140" is referred to as a dark tone. In some embodiments where mask 100 is an attenuated phase-shift mask, a reflectivity of opaque layer 140" is greater than 50%. In some embodiments where mask 100 is an alternating phase-shift mask, a reflectivity of opaque layer 140" is greater than about 50%. In some embodiments, opaque layer 140" further functions as a protective layer to protect phase shifter 130' against subsequent cleaning processes. In some embodiments, opaque layer 140" includes chromium, nickel, aluminum, ruthenium, iron oxide, tantalum boron nitride or another suitable material.

Figure 2:
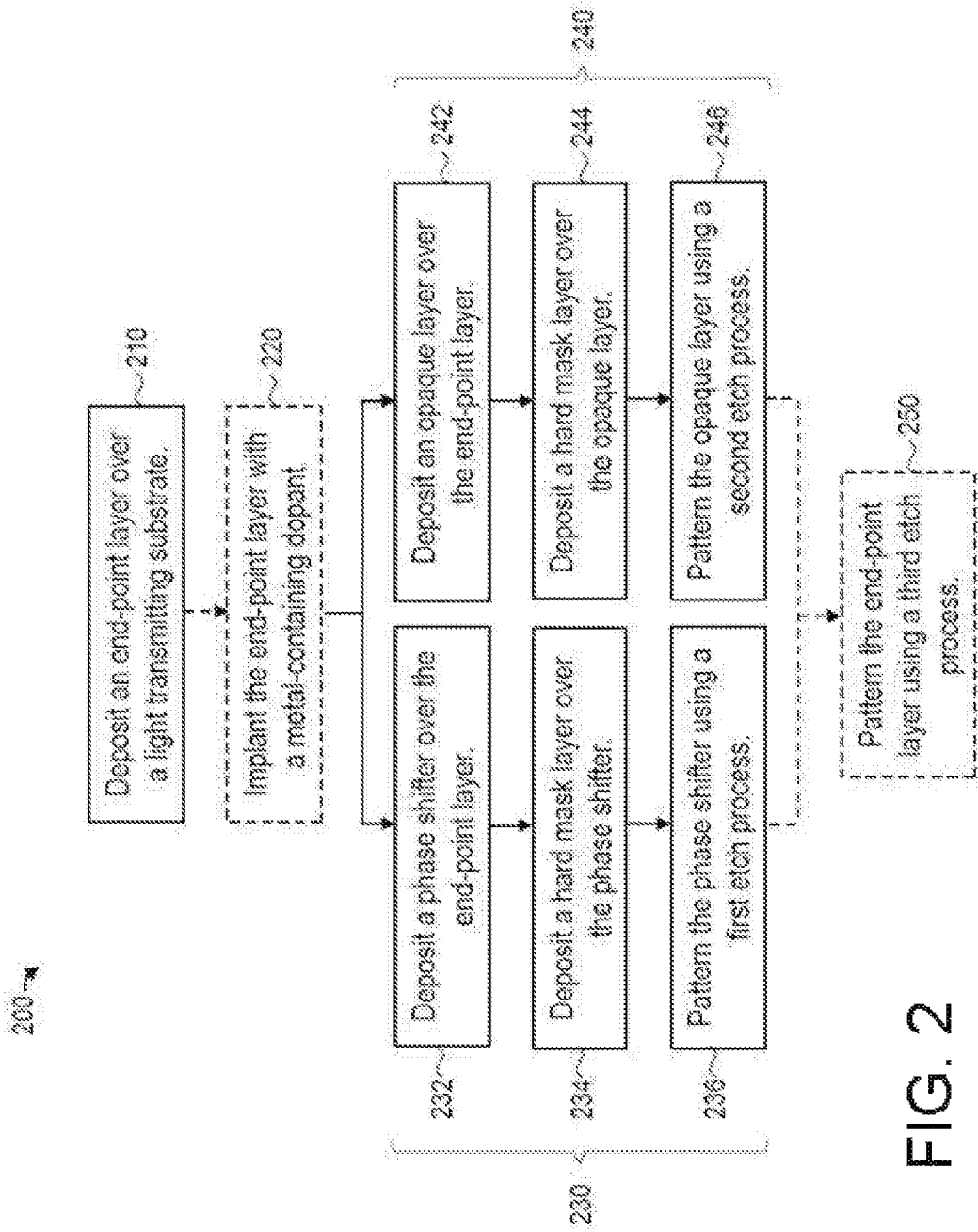
FIG. 2 is a flow chart of a method of manufacturing a mask in accordance with one or more embodiments.

FIG. 2 is a flowchart of a method 200 of manufacturing a mask in accordance with one or more embodiments. One of ordinary skill in the art would understand that additional operations are able to be performed before, during, and/or after method 200 depicted in FIG. 2, in some instances. Method 200 includes operation 210 in which an end-point layer, e.g., end-point layer 120 in FIG. 1, is deposited over a light transmitting substrate, e.g., substrate 110 in FIG. 1. The deposition of the end-point layer includes atomic layer deposition (ALD), chemical vapor deposition (CVD), physical vapor deposition (PVD), pulsed laser deposition (PLD), sputtering, spin-on-dielectric (SOD), or the like, or a combination thereof. The CVD process includes atmospheric pressure CVD (APCVD), low pressure CVD (LPCVD), plasma-enhanced CVD (PECVD) or high-density plasma CVD (HDPCVD).

In some embodiments, based on various types of mask, a thickness of the end-point layer ranges from about 5 angstrom (Å) to about 100 Å. A greater thickness increases a manufacturing cost without a significant improvement in functionality, in some instances. A smaller thickness increases a risk of over-etching, resulting in damage to the substrate, in some instances.

In some embodiments where end-point layer 120 includes silicon nitride and the light transmitting substrate includes silicon oxide, a concentration of silicon atom in end-point layer 120 is at 15% greater or smaller than a concentration of silicon atom in the light transmitting substrate. For example, for a light transmitting substrate having a concentration of silicon atom ranging from about 20% to about 40%, the concentration of silicon atom in the end-point layer ranges from about 35% to about 55% or from about 5% to 25%. In at least one instance, the concentration of silicon atom in silicon nitride is controlled by adjusting a nitrogen/argon ratio when sputtering a silicon target. A smaller nitrogen/argon ratio results in a greater concentration of silicon atom. For example, an ability to determine difference between the end-point layer and the substrate is reduced when the nitrogen/argon ratio is smaller than 30%.

In optional operation 220, the end-point layer 120 is implanted with a metal-containing dopant. A volume percentage of the metal-containing dopant ranges from about 20% to about 40%. A smaller volume percentage of the metal-containing dopant (e.g., smaller than 20%) causes insufficient conductivity to remove electron accumulation, which negatively affects an e-beam writing process, in some instances. A greater volume percentage of the metal-containing dopant (e.g., greater than 40%) increases a manufacturing cost without a significant improvement in functionality, in some instances. In some embodiments, the implantation is an in-situ process during the formation of the end-point layer. By adding the metal-containing dopant, a conductivity of the end-point layer is improved, thereby reducing a charge accumulation during a subsequent etch process, in some instances. In at least one embodiment, the metal-containing dopant includes aluminum, gallium, indium, oxides or other suitable materials. The implantation includes a single metal-containing dopant species or multiple metal-containing dopant species. In at least one embodiment, the end-point layer includes hafnium dioxide-alumina alloy.

In some embodiments where the mask is a phase-shift mask, method 200 continues with path 230. Path 230 is followed and proceeds with operation 232 in which a phase shifter, e.g., phase shifter 130' in FIG. 1, is deposited over the end-point layer. The deposition of the phase shifter includes ALD, CVD, PVD, PLD, sputtering, SOD, or the like, or a combination thereof. In some embodiments, the phase shifter is deposited by a same process as the end-point layer. In some embodiments, the phase shifter is deposited by a different process from the end-point layer. In some embodiments, based on a wavelength of a light source, a thickness of the phase shifter ranges from about 40 nm to about 100 nm. A greater or smaller thickness increases a deviation from a phase shift by π, reducing a pattern resolution, in some instances. However, one of ordinary skill in the art would understand that the thickness of the phase shifter is determined by a transmission rate of the selected material, wavelength of the light source, and a depth of focus (DOF) during the process. For example, where the phase shifter includes molybdenum and silicon oxynitride, the thickness of the phase shifter ranges from about 60 nm to about 70 nm.

Path 230 continues with operation 234. In operation 234, a hard mask layer is deposited over the phase shifter. In some embodiments, the hard mask layer includes silicon nitride, silicon carbide, silicon oxynitride, silicon oxycarbide or another suitable material. The deposition of the hard mask layer includes ALD, CVD, PVD, PLD, sputtering, SOD, the like, or a combination thereof. In some embodiments, the hard mask layer is deposited by a same process as the end-point layer or the phase shifter. In some embodiments, the hard mask layer is deposited by a different process from at least one of the end-point layer or the phase shifter. In some embodiments, in order to help improve the photolithography process, the hard mask layer has an anti-reflective property. In some embodiments, the hard mask layer includes silicon oxynitride, silicon oxycarbide, chromium, chromium oxide, chromium nitride, chromium oxynitride, titanium nitride, titanium silicon nitride, molybdenum silicon or another suitable materials. In some embodiments, the hard mask layer includes a single material, for example, silicon oxynitride. In some embodiments, the hard mask layer includes multiple layers, for example, a combination of silicon nitride and silicon oxynitride. In some embodiments, a thickness of the hard mask layer ranges from about 5 nm to about 25 nm. A greater thickness increases a manufacturing cost without a significant improvement in functionality, in some instances. A smaller thickness increases a risk of over-etching, resulting in damage to the phase shifter, in some instances.

In some embodiments, in order to help prevent undesired light leakage or where the mask is a triton mask, an opaque layer, e.g., opaque layer 140" in FIG. 1, is between the end-point layer and the hard mask layer. In at least one embodiment, the opaque layer is chromium. An optional chromium oxide is between the chromium and the hard mask layer to function as an anti-reflection layer and thereby help to prevent double exposure to a photoresist. The formation of the opaque layer includes a deposition process, such as ALD, CVD, PVD, PLD, sputtering, SOD, or the like, or a combination thereof. In some embodiments where the mask is a phase-shift mask, a thickness of the opaque layer ranges from about 30 nm to about 60 nm. A greater thickness increases absorption of incident light, thereby providing insufficient light intensity, in some instances. A smaller thickness causes light leakage or poor Z-contrast during the etch process, in some instances. In some embodiments where the mask is a binary mask, a thickness of the opaque layer is greater than 60 nm. However, one of ordinary skill in the art would understand that the thickness of the opaque layer is determined by a transmission rate of the selected material and a DOF during the process.

In operation 236, the phase shifter is patterned using a first etch process. A photoresist is deposited over hard mask layer and a photolithography process such as e-beam writing, laser writing, ultraviolet (UV), EUV or other suitable process is performed to define a pattern on the hard mask layer. Subsequently, the first etch process including a dry etching, a wet etching or a combination thereof is performed to remove a portion of the hard mask layer. In some embodiments where the mask has an opaque layer, a portion of the opaque layer exposed by the remaining portion of the hard mask layer is removed. The removal process includes a dry etching, a wet etching or a combination thereof. In some embodiments, the removal of the portion of the hard mask layer and the portion of the opaque layer thereunder is performed in a sequential manner, one layer is removed before another layer. In some embodiments, the removal of the portion of the hard mask layer and the portion of the opaque layer is performed in a single step. One of ordinary skill in the art would understand that a cleaning process is performed after the etch process in order to remove residue and by-product materials.

The phase shifter is subsequently patterned by an etch process, including a dry etching, a wet etching or a combination thereof. In some embodiments, the remaining portion of hard mask layer is used to pattern the phase shifter. In some embodiments where the mask includes an opaque layer, the remaining portion of the hard mask layer and the remaining portion of the opaque layer thereunder is used to pattern the phase shifter. In some embodiments, the remaining portion of the mask layer is removed and then the remaining portion of the opaque layer thereunder is used to pattern the phase shifter. In some embodiments, the removal of a portion of the phase shifter and the portion of the opaque layer is performed in a sequential manner. In some embodiments, the removal of the portion of the phase shifter and the portion of the opaque layer thereunder is performed in a single step.

During the removal of the phase shifter, the e-beam is generated for scanning a compositional and/or topographical properties of a surface of the mask. In some embodiments, an energy of the e-beam is in a range from about 0.75 keV to about 30 keV. A greater energy increases a manufacturing cost, in some instances. A smaller energy is insufficient to provide a high resolution, in some instances. The e-beam emission results in primary electrons and secondary electrons. The BSE, which results from elastic interactions between the incident electrons and target object, and/or secondary electron (SE) emission is monitored concurrently. In some embodiments, a BSE signal is detected by a BSE signal detector, for example, an Energy and angle Selective BSE (ESB) detector. In some embodiments, a SE signal is filtered and excluded from the BSE signal detector to enhance the Z-contrast. In at least one embodiment, the BSE signal is dynamically collected to generate a grayscale image, which corresponds to an average atomic number of a scanned region, to present a compositional and/or a topographical property of the surface of the mask. A grayscale level of the grayscale image is determined in a range of atomic number of materials which are being scanned, and the grayscale image is mapped by the determined grayscale level. In some embodiments, one or more reference points of the grayscale level is determined by the materials being scanned. In some embodiments, the grayscale image is a bitmap image where each pixel has a value in a range from 0 to 255. In some embodiments, the grayscale image is a bitmap image where each pixel has a value in a range from −255 to 255. A material with a greater average atomic number results in greater interactions of accelerated electrons between the BSE and a surface of the material, thereby forming a relatively brighter image under a BSE detector than a smaller average atomic number. In some embodiments where an average atomic number of the end-point layer is greater than an average atomic number of the phase shifter, the etch process stops when the BSE detector receives an increased BSE signal of a predetermined value. For example, when the end-point layer includes hafnium oxide and the phase shifter includes nitride, the predetermined value is set around 140.

Alternatively, in some embodiments where the mask is a binary mask, following operation 210 or optional operation 220, method 200 continues with path 240. Path 240 is followed and proceeds with operation 242 in which an opaque layer is deposited over the end-point layer. The deposition of the opaque layer includes ALD, CVD, PVD, PLD, sputtering, SOD, or the like, or a combination thereof. In some embodiments, the opaque layer is deposited by a same process as the end-point layer. In some embodiments, the opaque layer is deposited by a different process from the end-point layer. In some embodiments, a thickness of the opaque layer ranges from about 3 nm to about 80 nm. A greater thickness increases a manufacturing cost without a significant improvement in functionality, in some instances. A smaller thickness is insufficient to block undesired incident light, in some instances. In some embodiments, a thickness of the opaque layer is greater than 60 nm. One of ordinary skill in the art would understand that the thickness of the opaque layer is determined by a transmission rate of the selected material and a DOF during the process. For example, where the mask is an opaque molybdenum silicon on glass (OMOG) mask, a thickness of the opaque layer ranges from about 3 nm to about 10 nm.

Path 240 continues with operation 244. In operation 244, a hard mask layer is deposited over the opaque layer. In some embodiments, the hard mask layer includes silicon nitride, silicon carbide, silicon oxynitride, silicon oxycarbide or another suitable material. The deposition of the hard mask layer includes ALD, CVD, PVD, PLD, sputtering, SOD, or the like, or a combination thereof. In some embodiments, the hard mask layer is deposited by a same process as the end-point layer or the opaque layer. In some embodiments, the hard mask layer is deposited by a different process from at least one of the end-point layer or the opaque layer. In some embodiments, in order to help improve the photolithography process, the hard mask layer has an antireflective property. In some embodiments, the hard mask includes silicon oxynitride, silicon oxycarbide, chromium, chromium oxide, chromium nitride, chromium oxynitride, titanium nitride, titanium silicon nitride, molybdenum silicon or another suitable material. In some embodiments, the hard mask layer includes a single material, for example, silicon oxynitride. In some embodiments, the hard mask layer includes multiple layers, for example, a combination of silicon nitride and silicon oxynitride. In some embodiments, a thickness of the hard mask layer ranges from about 5 nm to about 25 nm. A greater thickness increases a manufacturing cost without a significant improvement in functionality, in some instances. A smaller thickness increases a risk of over-etching, resulting in damage to the opaque layer, in some instances.

In operation 246, the opaque layer is patterned using a second etch process. A photoresist is deposited over hard mask layer and a photolithography process such as e-beam writing, laser writing, UV, EUV or other suitable process is performed to define a pattern on the hard mask layer. Subsequently, the second etch process including a dry etching, a wet etching or a combination thereof is performed to remove a portion of the hard mask layer. One of ordinary skill in the art would understand that a cleaning process is performed after the second etch process in order to remove residue and by-product materials.

Following operation 236 or operation 246, the method continues with optional operation 250 in which the end-point layer is patterned using a third etch process. In some embodiments where the end-point layer absorbs more incident light than the substrate or the end-point layer is not transparent to pass sufficient incident light, the end-point layer is removed after the removal of the phase shifter when the mask is a phase-shift mask or the opaque layer when the mask is a binary mask. The third etch process is different from the first etch process and the second etch process. For example, in some embodiments where the phase shifter includes silicon nitride and the end-point layer includes hafnium oxide, the phase shifter is removed using a fluorine-containing etchant gas and the end-point layer is removed using a chlorine-containing etchant gas. In at least one embodiment, the end-point layer has an etch selectivity different from the substrate.

In some embodiments, additional operations are included in method 200, such as an annealing process is performed after the implantation of the end-point layer. In such a way, the dopants diffuse from a top surface of the end-point layer toward a bottom portion of the end-point layer to form a more uniform conductivity. In some embodiments, the annealing is performed at a temperature ranging from about 500 degrees Celsius to about 900 degrees Celsius. A higher temperature damages the substrate, in some instances. A lower temperature is not sufficient to cause the diffusion, in some instances. After the annealing process, the BSE signal improves because the end-point layer has a better conductivity. As another example, in some embodiments where the mask is an alternating phase-shift mask or a chromeless mask, a portion of the substrate is removed in order to cause a phase shift by $\pi$. In some embodiments, the removal of the end-point layer and the substrate is performed in a sequential manner. In some embodiments, the removal of the end-point layer and the substrate is performed in a single step. Furthermore, an optional repair process for removing residue defects is performed and discussed below in more detail in association with cross-sectional views corresponding to the operations of the flow diagram.

Figure 3A:
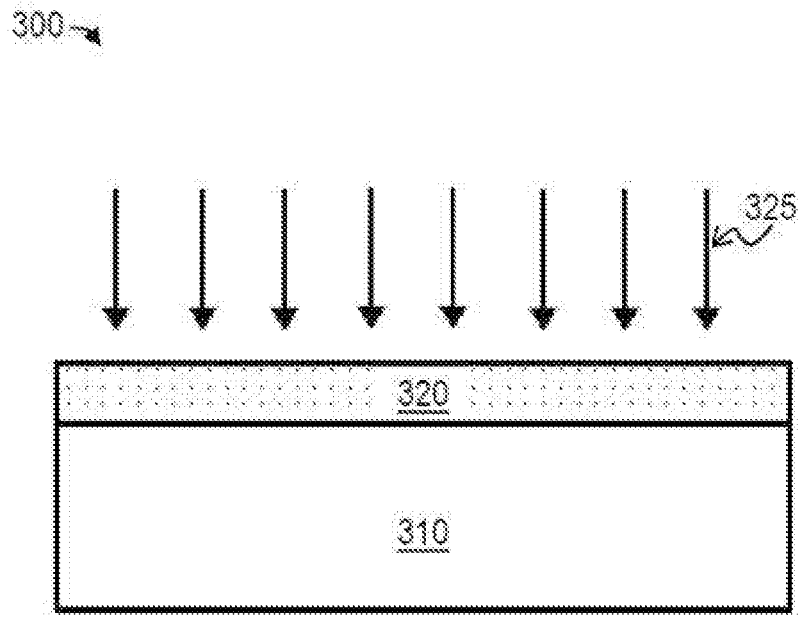
FIGS. 3A-3F are cross-sectional views of a mask at various stages of manufacturing in accordance with one or more embodiments.

FIGS. 3A-3F are cross-sectional views at various stages of manufacturing a mask 300 in accordance with one or more embodiments. Mask 300 includes elements similar to mask 100 and a last two digits of like elements are the same. FIG. 3A is a cross-sectional view of mask 300 following optional operation 220. Mask 300 includes a substrate 310 and an end-point layer 320. In at least one embodiment, an implantation process 325 is performed to end-point layer 320 using a metal-containing dopant, such as aluminum oxide.

Figure 3B:
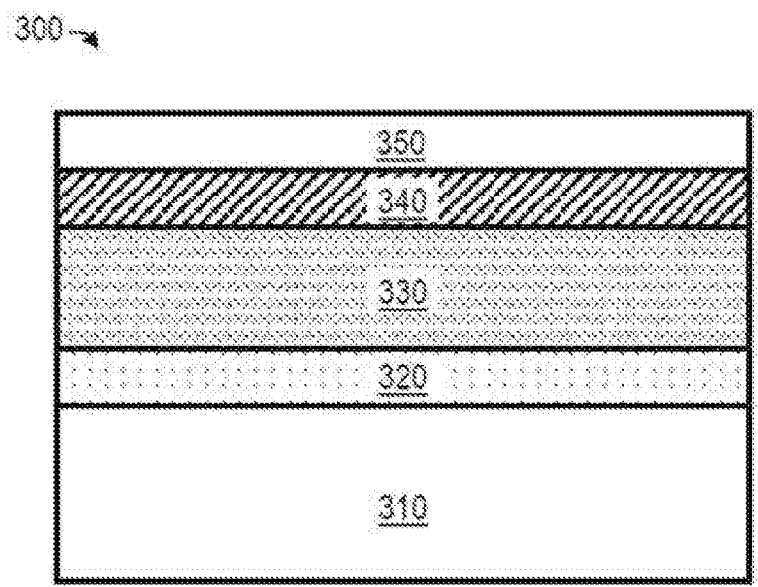

FIG. 3B is a cross-sectional view of mask 300 following operation 234. Mask 300 further includes a phase shifter 330, an opaque layer 340 and a hard mask layer 350. In some embodiments, an anti-reflective layer is optionally formed between opaque layer 340 and hard mask layer 350. In some embodiments, the anti-reflective layer is further formed over hard mask layer 350.

Figure 3C:
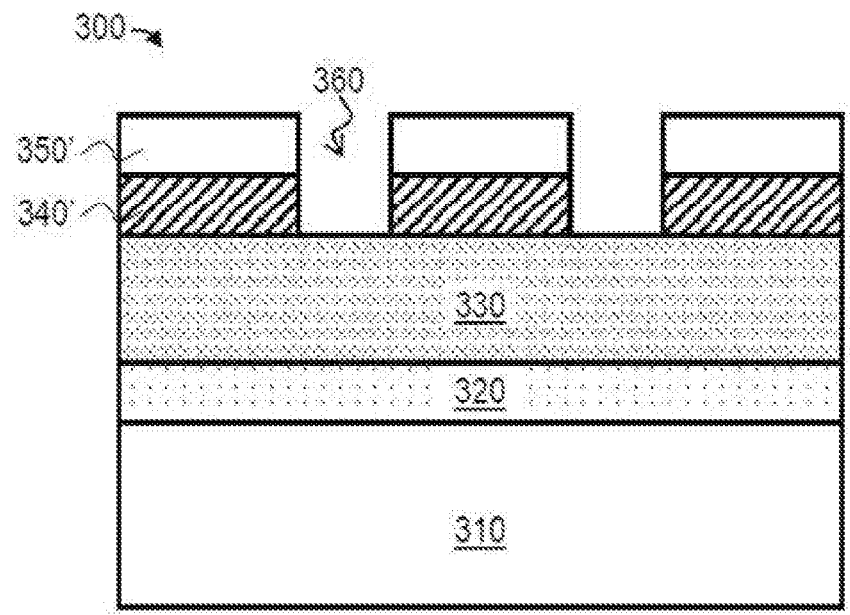

FIG. 3C is a cross-sectional view of mask 300 after operation 234. A portion of hard mask layer 350 and a portion of opaque layer 340 are removed by one or more etch processes. An opaque layer 340' and a hard mask layer 350' are separated by an opening 360 in order to expose a portion of phase shifter 330.

Figure 3D:
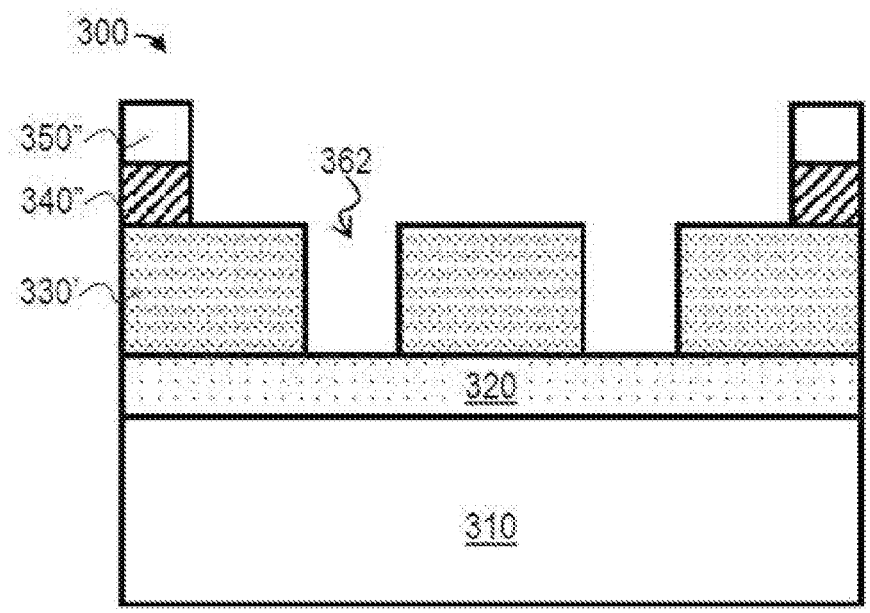

FIG. 3D is a cross-sectional view of mask 300 following operation 236. A portion of phase shifter 330 is defined by opening 360 and is removed to expose a portion of end-point layer 320. Each of remaining phase shifter 330' is separated by an opening 362. Next, a portion of opaque layer 340' and a portion of hard mask layer 350' are removed to extend along a peripheral of mask 300. In some embodiments, a formation of an opaque layer 340" and a hard mask layer 350" includes a photolithography process and an etch process.

Figure 3E:
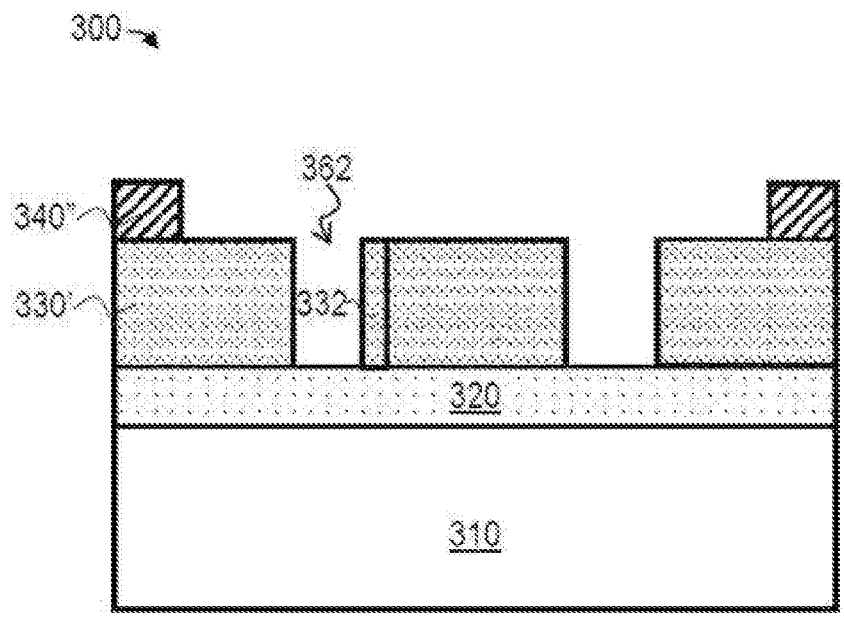

FIG. 3E is a cross-sectional view of mask 300 following an optional repair phase shifter 330'. Hard mask layer 350" (best seen in FIG. 3D) is removed by an etch process. For example where hard mask layer 350" includes silicon oxynitride, a chemical etching using phosphoric acid is performed. Following the removal of hard mask 350", in some embodiments, a residue defect 332, which is caused from particle dropping and is formed along a sidewall of phase shifter 330', is identified under an inspection process. In some embodiments, residue defect 332 extends from phase shifter 330'. In some embodiments, a height of residue defect 332 is equal to or lower than phase shifter 330'. After the inspection process indicates a presence and location of residue defect 332, an etch process using a halogen-containing etchant gas is applied to remove residue defect 332. An etch selectivity of residue defect 332 is different from an etch selectivity of end-point layer 320. For example, where residue defect 332 includes silicon nitride and end-point layer 320 includes hafnium oxide, a fluorine-based etchant gas is applied.

Figure 3F:
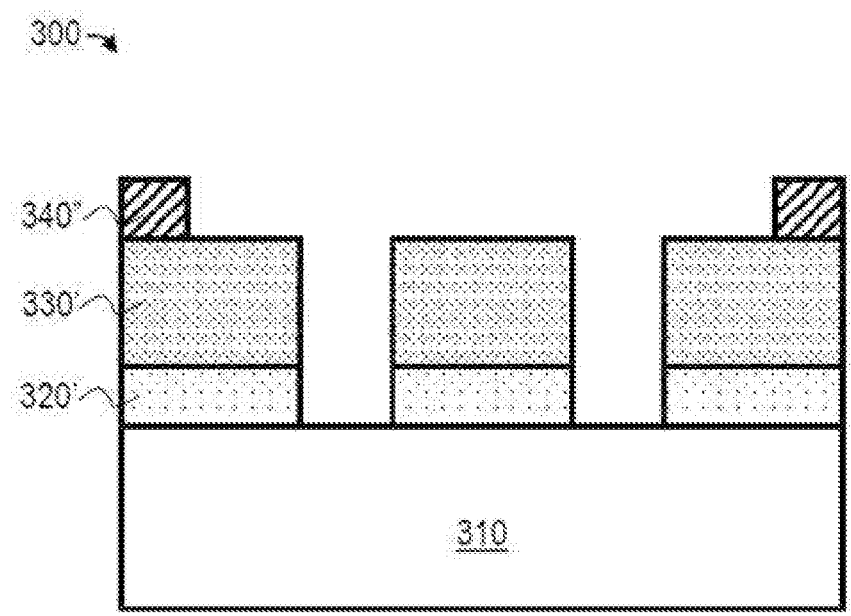

FIG. 3F is a cross-sectional view of mask 300 after optional operation 250. A portion of end-point layer 320 is defined by opening 362 (best seen in FIG. 3E) and is removed to expose a portion of substrate 310.

Figure 4A:
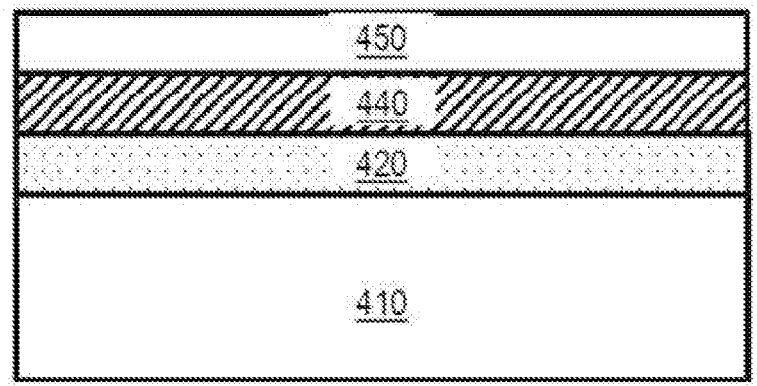
FIGS. 4A-4B are cross-sectional views of a mask at various stages of manufacturing in accordance with one or more embodiments.
Figure 4B:
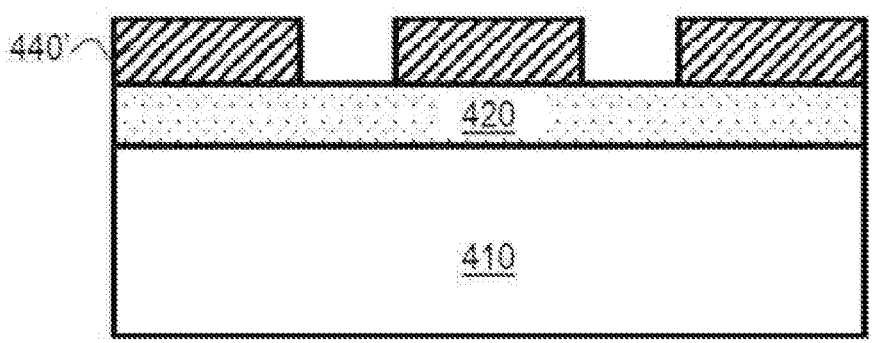

FIGS. 4A-4B are cross-sectional views at various stages of manufacturing a mask 400 in accordance with one or more embodiments. Mask 400 includes elements similar to mask 100 and a last two digits of like elements are the same. FIG. 4A is a cross-sectional view of mask 400 following operation 244. Mask 400 includes a substrate 410, an end-point layer 420, an opaque layer 440 and a hard mask 450. In some embodiments where mask 400 is an OMOG mask, a molybdenum silicon layer is between end-point layer 420 and hard mask 450. In some embodiments where mask 400 is an OMOG mask, mask 400 further includes a molybdenum silicon oxynitride over substrate 410 and a chromium oxide layer over the molybdenum silicon oxynitride.

FIG. 4B is a cross-sectional view of mask 400 following operation 246. A portion of opaque layer 440 is removed to expose a portion of end-point layer 420. One of ordinary skill in the art would understand that a portion of end-point layer 420 is also removed to expose a portion of substrate 410.

One aspect of this description relates to a method of manufacturing a mask. The method includes depositing an end-point layer over a light transmitting substrate. The end-point layer and the light transmitting substrate are transparent to a predetermined wavelength. The method further includes depositing a phase shifter over the end-point layer, depositing a hard mask layer over the phase shifter, and removing a portion of the hard mask layer and a first portion of the phase shifter to expose a portion of the end-point layer.

Another aspect of this description relates to a method of manufacturing a reticle. The method includes depositing an end-point layer over a transparent substrate, depositing a phase shifter over the end-point layer, wherein a difference of a grayscale image of the phase shifter and the transparent substrate is smaller than a difference of a grayscale image of the end-point layer and the transparent substrate, depositing an opaque layer over the phase shifter, and patterning the opaque layer and the phase shifter to expose a portion of the end-point layer.

Still another aspect of this description relates to a photomask. The photomask includes a substrate, an end-point layer over the substrate, wherein a band gap energy of the end-point layer is equal to or greater than 6 eV, and a phase shifter over the end-point layer, wherein the phase shifter is configured to shift a phase of incident light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a mask, comprising:
   depositing an end-point layer over a light transmitting substrate, wherein the end-point layer and the light transmitting substrate are transparent to a predetermined wavelength;
   depositing a phase shifter over the end-point layer;
   depositing an opaque layer over the phase shifter;
   depositing a hard mask layer over the opaque layer;
   removing a portion of the hard mask layer, a portion of the opaque layer and a first portion of the phase shifter to expose a portion of the end-point layer;
   removing remaining portions of the hard mask layer; and
   repairing a third portion of the phase shifter after removing the remaining portions of the hard mask layer.

2. The method of claim 1, wherein the depositing of the end-point layer comprises:
   depositing a material having a band gap energy equal to or greater than 6 electron volts (eV).

3. The method of claim 1, wherein the depositing of the end-point layer comprises:
   depositing a material having an average atomic number greater than an average atomic number of the light transmitting substrate.

4. The method of claim 1, wherein the depositing of the end-point layer comprises:
   depositing a material having an average atomic number smaller than an average atomic number of the light transmitting substrate.

5. The method of claim 1, wherein the depositing of the end-point layer comprises:
   depositing the end-point layer to have a thickness equal to or less than 100 angstrom (A).

6. The method of claim 1, wherein the removing of the portion of the hard mask layer and the first portion of the phase shifter comprises:
   monitoring a backscattered electron (BSE) signal of the mask; and
   transmitting a stop signal when a predetermined BSE signal is generated.

7. The method of claim 1, further comprising:
   implanting the end-point layer with a metal-containing dopant.

8. The method of claim 7, further comprising:
   annealing the end-point layer at a temperature ranging from about 500 degrees Celsius to about 900 degrees Celsius after the implanting of the end-point layer.

9. The method of claim 1, further comprising:
   removing a portion of the opaque layer to expose a second portion of the phase shifter.

10. The method of claim 1, wherein repairing the third portion of the phase shifter comprises using a halogen-containing etchant.

11. A method of manufacturing a reticle, comprising:
    depositing an end-point layer over a transparent substrate;
    depositing a phase shifter over the end-point layer, wherein a difference of a grayscale image of the phase shifter and the transparent substrate is smaller than a difference of a grayscale image of the end-point layer and the transparent substrate;
    depositing an opaque layer over the phase shifter;
    patterning, using a hard mask layer over the opaque layer, the opaque layer and the phase shifter to expose a portion of the end-point layer; and
    maintaining the entirety of the end-point layer through an entirety of the method.

12. The method of claim 11, wherein the depositing of the end-point layer comprises:
    depositing a material having an average atomic number greater than 14.

13. The method of claim 11, wherein the depositing of the end-point layer comprises:
    depositing a hafnium oxide layer.

14. The method of claim 11, further comprising:
    detecting a compositional backscattered electron (BSE) signal of the reticle to generate a grayscale image.

15. The method of claim 11, further comprising:
    implanting the end-point layer with aluminum oxide.

16. The method of claim 11, further comprising:
    removing the portion of the end-point layer.

17. A photomask comprising:
    a substrate;
    an end-point layer over an entire surface of the substrate, wherein a band gap energy of the end-point layer is equal to or greater than 6 electron volt (eV);
    a phase shifter over the end-point layer, wherein the phase shifter is configured to shift a phase of incident light, the phase shifter exposes a portion of the end-point layer, the phase shifter comprises a first portion and a second portion, and the first portion is closer to a center of the photomask than the second portion; and
    an opaque layer over the phase shifter, wherein the opaque layer exposes the first portion of the phase shifter and the portion of the end-point layer.

18. The photomask of claim 17, wherein
    an average atomic number of the end-point layer is greater than an average atomic number of the substrate.

19. The photomask of claim 17, wherein the opaque layer is configured to absorb the incident light, and the opaque layer extends along a peripheral of the photomask.

20. The photomask of claim 17, wherein the end-point layer has at least one metal-containing dopant species.

* * * * *